United States Patent
Endo

(10) Patent No.: US 11,428,715 B2
(45) Date of Patent: Aug. 30, 2022

(54) CURRENT MEASUREMENT DEVICE

(71) Applicant: KOA CORPORATION, Ina (JP)

(72) Inventor: Tamotsu Endo, Nagano (JP)

(73) Assignee: KOA CORPORATION, Nagano (JP)

( * ) Notice: Subject to any disclaimer, the term of this patent is extended or adjusted under 35 U.S.C. 154(b) by 129 days.

(21) Appl. No.: 16/640,127

(22) PCT Filed: Jul. 20, 2018

(86) PCT No.: PCT/JP2018/027287
§ 371 (c)(1),
(2) Date: Feb. 19, 2020

(87) PCT Pub. No.: WO2019/044258
PCT Pub. Date: Mar. 7, 2019

(65) Prior Publication Data
US 2021/0190834 A1   Jun. 24, 2021

(30) Foreign Application Priority Data
Aug. 29, 2017  (JP) .............................. JP2017-164643

(51) Int. Cl.
*G01R 19/00* (2006.01)
*G01R 1/20* (2006.01)
*G01R 1/30* (2006.01)

(52) U.S. Cl.
CPC ......... *G01R 19/0023* (2013.01); *G01R 1/203* (2013.01); *G01R 1/30* (2013.01)

(58) Field of Classification Search
CPC ...... G01R 19/0023; G01R 1/203; G01R 1/30; G01R 19/0092; G01R 31/2879;
(Continued)

(56) References Cited

U.S. PATENT DOCUMENTS

2010/0072898 A1\* 3/2010 Ohashi .................. H05B 45/10
  315/127
2014/0125429 A1\* 5/2014 Yoshioka ............... G01R 1/203
  333/172
(Continued)

FOREIGN PATENT DOCUMENTS

JP  2011112510 A   6/2011
JP  2014142224 A \*  8/2014
(Continued)

OTHER PUBLICATIONS

International Search Report and Written Opinion, and English translation of Search Report, for Application No. PCT/JP2018/027287, dated Oct. 9, 2018, 9 pages.

*Primary Examiner* — Lee E Rodak
*Assistant Examiner* — Brent J Andrews
(74) *Attorney, Agent, or Firm* — Crowell & Moring LLP

(57) ABSTRACT

A current measurement device comprising: a shunt resistor; a pair of first and second voltage signal lines connected to the shunt resistor; and a current measurement circuit for measuring a current using a signal by the pair of first and second voltage signal lines. The pair of first and second voltage signal lines are connected to an amplifier circuit with which the current measurement circuit is provided to amplify a voltage signal. A third signal line which is a signal line different from the pair of first and second voltage signal lines and drawn from the shunt resistor is connected to a common line of the current measurement circuit.

7 Claims, 6 Drawing Sheets

(58) Field of Classification Search
CPC ...... G01R 15/00; G01R 31/42; G01R 15/146; G01R 19/00
See application file for complete search history.

(56) References Cited

U.S. PATENT DOCUMENTS

| | | | |
|---|---|---|---|
| 2015/0245490 A1* | 8/2015 | Kondou | G01R 1/203 174/260 |
| 2015/0260760 A1* | 9/2015 | Katakura | G01R 1/203 324/715 |
| 2016/0356825 A1 | 12/2016 | Bae et al. | |
| 2017/0023623 A1 | 1/2017 | Tsuchida et al. | |
| 2017/0212150 A1* | 7/2017 | Kang | G01R 15/146 |
| 2018/0156847 A1 | 6/2018 | Nakamura et al. | |

FOREIGN PATENT DOCUMENTS

| | | |
|---|---|---|
| JP | 2014142224 A | 8/2014 |
| JP | 2016118437 A | 6/2016 |
| JP | 2017015588 A | 1/2017 |
| JP | 2017-028859 A | 2/2017 |

* cited by examiner

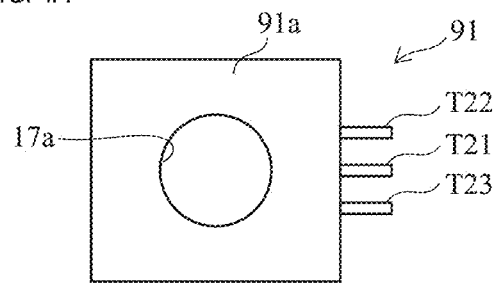
FIG. 4A
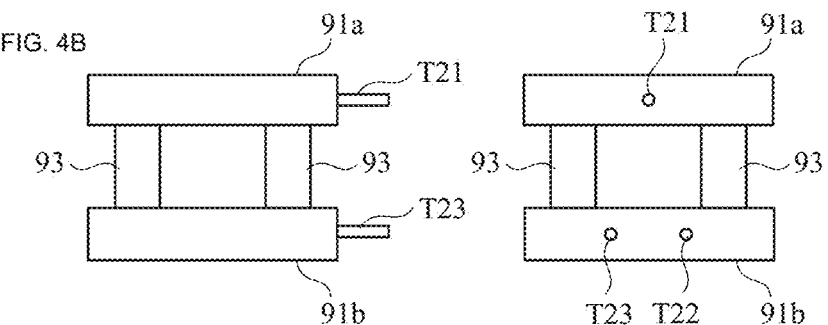
FIG. 4B
FIG. 4C
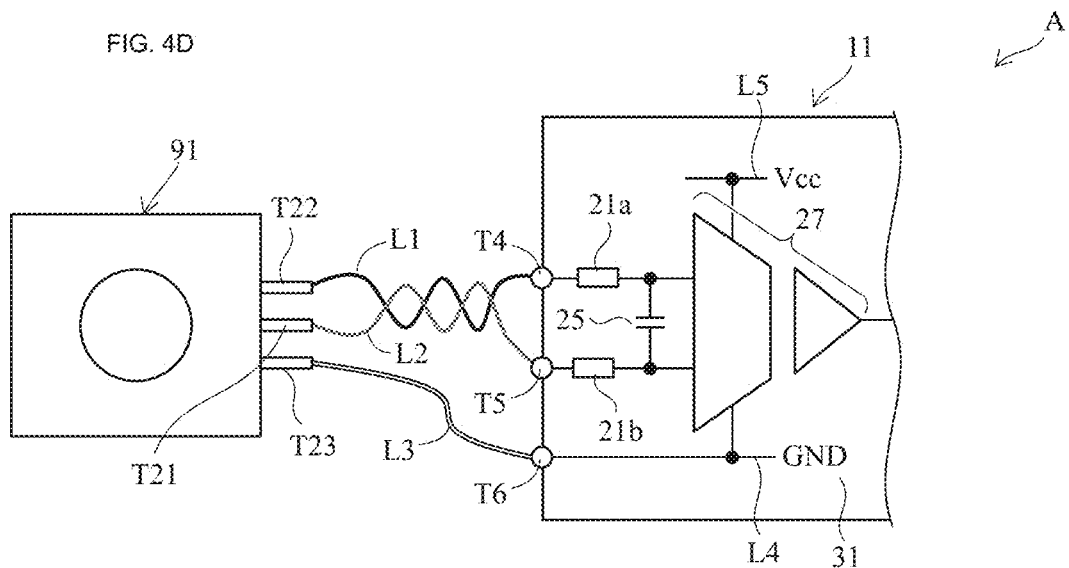
FIG. 4D

CURRENT MEASUREMENT DEVICE

RELATED APPLICATIONS

This application is a 371 application of PCT/JP2018/027287 having an international filing date of Jul. 20, 2018, which claims priority to JP2017-164643 filed Aug. 29, 2017, the entire content of each of which is incorporated herein by reference.

TECHNICAL FIELD

The present invention relates to a current measurement device.

BACKGROUND ART

A shunt resistor is configured of two current terminals for applying a current to be measured, and two signal output terminals or electric wires for extracting a detection voltage signal (see Patent Literature 1, for example).

CITATION LIST

Patent Literature

Patent Literature JP 2014-142224 A

SUMMARY OF INVENTION

Technical Problem

However, as the current to be measured increases, it becomes necessary to make the shunt resistance value smaller to reduce loss due to the shunt resistor. As a result, the shunt detection voltage also has a weaker signal level, and becomes more likely to be affected by noise that is not considered in Patent Literature 1.

In such case, weak common-mode noise that has not been considered a problem is also amplified by a high-sensitivity amplifier, making it impossible to perform high-accuracy current detection. Accordingly, there has been the problem that for uses in which common-mode noise becomes large, it is difficult to use a shunt resistor with the resistance value thereof lowered.

An object of the present invention is to provide a current measurement device which is capable of performing high-accuracy current detection by reducing the influence of common-mode noise.

Solution to Problem

According to the present invention, a one more terminal or electric wire is additionally connected to a power supply line of an amplifier circuit. In this way, it becomes possible to suppress the influence of common-mode noise.

According to an aspect of the present invention, there is provided a current measurement device including a shunt resistor; a pair of first and second voltage signal lines connected to the shunt resistor; and a current measurement circuit for measuring a current using a signal by the pair of first and second voltage signal lines. The pair of first and second voltage signal lines are connected to an amplifier circuit with which the current measurement circuit is provided to amplify a voltage signal. A third signal line which is a signal line different from the pair of first and second voltage signal lines and drawn from the shunt resistor is connected to a common line of the current measurement circuit.

The third signal line may reduce an influence of a common-mode noise of the common line on the pair of first and second voltage signal lines.

The amplifier circuit may have a GND terminal connected to the common line.

The amplifier circuit may have a negative power supply terminal connected to the common line.

The shunt resistor may perform current detection in a main circuit, such as an inverter circuit provided with a switching element.

Preferably, the amplifier circuit may have a resistance in a signal input portion for each of the pair of first and second voltage signal lines.

Preferably, the shunt resistor may have a resistance value of not more than 0.1 mΩ. This is because use of a low-resistance shunt resistor results in a greater influence of noise.

The description includes the contents disclosed in JP Patent Application No. 2017-164643 from which the present application claims the priority.

Advantageous Effects of Invention

According to the present invention, it is possible to suppress the influence of common-mode noise during current detection.

BRIEF DESCRIPTION OF DRAWINGS

FIGS. 4A, 4B, 4C and 4D show plan views and side views illustrating a configuration example of a shunt resistor in a current measurement device according to a fourth embodiment of the present invention.

DESCRIPTION OF EMBODIMENTS

In the following, the current measurement device according to embodiments of the present invention will be described with reference to the drawings.

First Embodiment

Figure 1A:
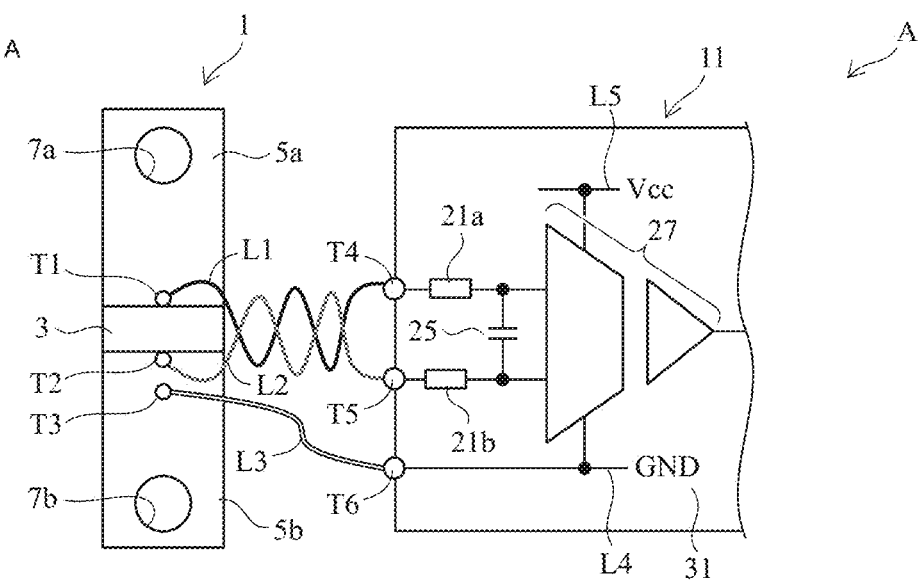
FIG. 1A is a circuit diagram illustrating a configuration example of a current measurement device according to an embodiment of the present invention.
Figure 1B:
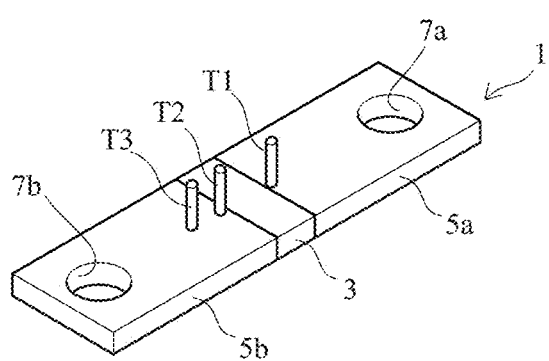
FIG. 1B is a perspective view illustrating a configuration example of a shunt resistor of the current measurement device according to the embodiment of the present invention.

FIG. 1A is a circuit diagram illustrating a configuration example of a current measurement device A according to an embodiment of the present invention. FIG. 1B is a perspective view illustrating a configuration example of a shunt resistor 1 of the current measurement device according to the embodiment of the present invention.

As illustrated in FIG. 1A and FIG. 1B, the shunt resistor 1 includes a resistive element 3, and a first electrode 5a and a second electrode 5b disposed at both ends of the resistive element 3.

FIGS. 1A and 1B illustrate a butt joint structure in which, by way of example, an end face of the resistive element 3 and end faces of the electrodes 5a, 5b are butted together; however, the butt joint structure does not represent a limitation.

As the material of the resistive element 3, it is possible to use plate material of Cu—Ni-based, Cu—Mn-based, or Ni—Cr-based metals, for example. As the electrode material of the terminal portions 5, it is possible to use Cu, for example. The shunt resistor 1 has a low resistance value of not more than 0.1 mΩ, for example.

The electrodes 5a, 5b have holes 7a, 7b for securing to a substrate, a bus bar or the like which are not illustrated. The electrodes 5a, 5b are provided, on the sides thereof that are joined with the resistive element 3, with a first signal output terminal T1 and a second signal output terminal T2 extending vertically from their electrode surfaces. A third signal output terminal T3 is further provided in proximity to the second signal output terminal T2 and extending vertically from an electrode surface of the second electrode 5b.

The current measurement device A includes an amplifier circuit (substrate) 11 which is connected to the shunt resistor 1 to amplify an output signal from the shunt resistor 1. The amplifier circuit 11 is provided with a Δ-Σ conversion analog isolation amplifier 27 comprising a photocoupler or a capacitive coupling capacitor, for example.

The first signal output terminal T1 and the second signal output terminal T2 of the shunt resistor 1 are connected to two input terminals T4, T5 of the amplifier circuit 11 respectively by wires L1, L2. Further, the third signal output terminal T3 is provided and connected to a negative power supply terminal T6, which is in electrical communication with a common line L4 (GND 31) of the amplifier circuit 11, by a wire L3.

Preferably, the wires L1 and L2 are stranded wires.

The amplifier circuit 11 has the input terminals T4, T5 connected to the isolation amplifier 27 via resistors 21a, 21b respectively. A capacitor 25 is disposed between the wires from the input terminals T4, T5. In this way, it is possible to suppress entry of normal mode noise into the isolation amplifier 27. The isolation amplifier 27 has a positive power supply terminal connected to L5 (Vcc) and a negative power supply terminal connected to L4 (GND 31).

The shunt resistor 1 and the amplifier circuit 11 are connected by the 5-terminal system (5a, 5b, T1, T2, T3), whereby common-mode noise passes through T3→L3→T6→L4 and drops to GND 31 on the amplifier circuit side. Accordingly, it is possible to reduce the influence of common-mode noise on the pair of voltage signal lines (wires L1, L2) connected to the amplifier circuit 11 provided in the current measurement device A to amplify signals.

Second Embodiment

A current measurement device according to a second embodiment of the present invention will be described.

Figure 2:
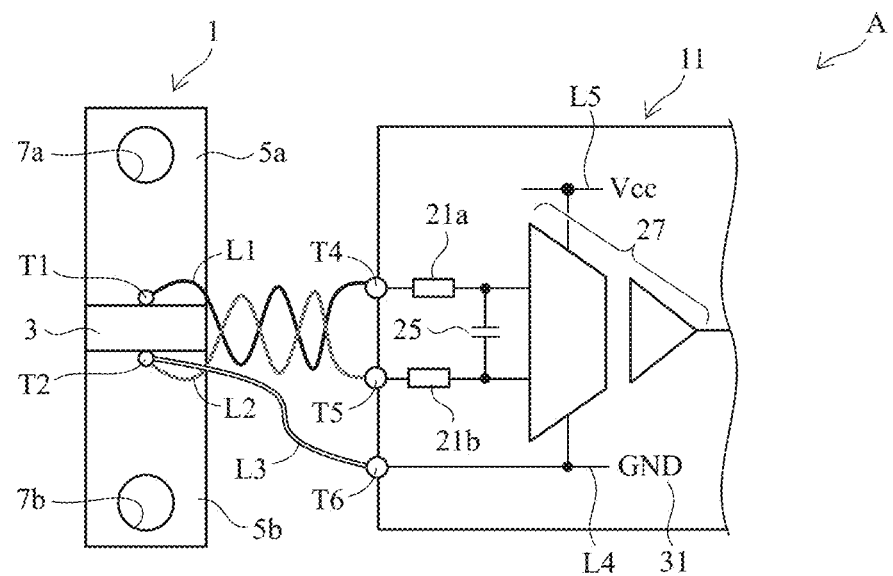
FIG. 2 is a circuit diagram illustrating a configuration example of a current measurement device according to a second embodiment of the present invention.

FIG. 2 is a circuit diagram illustrating a configuration example of the current measurement device A according to the present embodiment. In the configuration example illustrated in FIG. 2, compared to the configuration example illustrated in FIG. 1, the shunt resistor 1 does not have the terminal T3. Instead, the wire L2 from the second signal output terminal T2 to the input terminal T5 of the amplifier circuit 11 and the wire L3 to the common line L4 (GND 31) both branch out of the terminal T2. With this configuration, it is also possible to obtain effects similar to those of FIG. 1. In addition, there is the feature that it is not necessary to provide the terminal T3.

Third Embodiment

A current measurement device according to a third embodiment of the present invention will be described.

Figure 3:
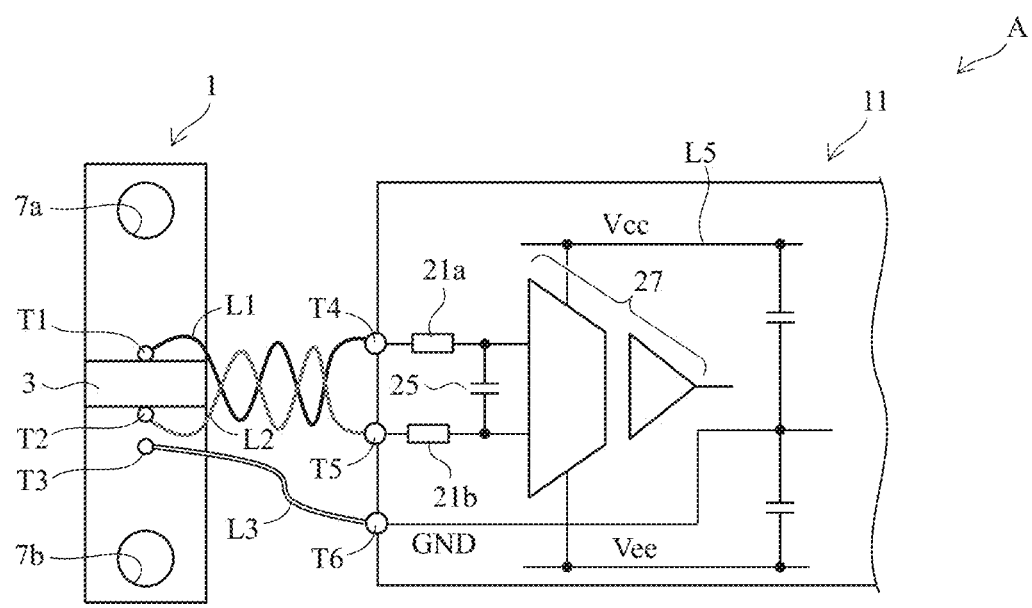
FIG. 3 is a circuit diagram illustrating a configuration example of a current measurement device according to a third embodiment of the present invention.

FIG. 3 is a circuit diagram illustrating a configuration example of the current measurement device according to the present embodiment. The configuration example illustrated in FIG. 3 differs from the configuration illustrated in FIG. 1 in that the amplifier circuit 11 (isolation amplifier 27) is supplied with a minus power supply Vee, and that GND is provided separately from the power supply Vee. The terminal T6 is connected to GND of the amplifier circuit 11 (In the present example, T6 is referred to specifically as a GND terminal). The wire L3 is connected to the GND terminal T6.

In this way, the amplifiable range on the minus side is increased for signal output, providing the advantage that a decrease in amplification range due to the influence of common-mode noise is mitigated.

Fourth Embodiment

A current measurement device according to a fourth embodiment of the present invention will be described.

FIGS. 4A, 4B and 4C illustrate a configuration example of a shunt resistor 91 in a current measurement device according to the present embodiment, wherein FIG. 4A shows a plan view, FIG. B shows a front view, and FIG. C shows a side view. A back-surface view is similar to the plan view shown by FIG. 4A. In the configuration example illustrated in FIGS. 4A-4C, the shunt resistor 91 includes a plurality of columnar resistive elements 93 disposed between two electrodes 91a, 91b which are arranged so as to oppose each other. Each of the electrodes 91a, 91b has a through-hole 17a for securing to a bus bar or the like. From the sides of the electrodes 91a, 91b, terminals T21 to T23 protrude laterally. With the shunt resistor, it is possible to realize a shunt resistor having lower resistance. FIG. 4D illustrates an example in which the shunt resistor 91 is connected to the amplifier circuit 11 illustrated in FIG. 1. A terminal T21 as a first signal output terminal and a terminal T22 as a second signal output terminal are connected to the two input terminals T4, T5 of the amplifier circuit 11 respectively by the wires L1, L2. A terminal T23 as a third signal output terminal is connected by the wire L3 to the negative power supply terminal T6, which is in electrical communication with the common line L4 (GND 31) of the amplifier circuit 11. With this configuration, it is possible to reduce the influence of common-mode noise more effectively.

Fifth Embodiment

Figure 5A:
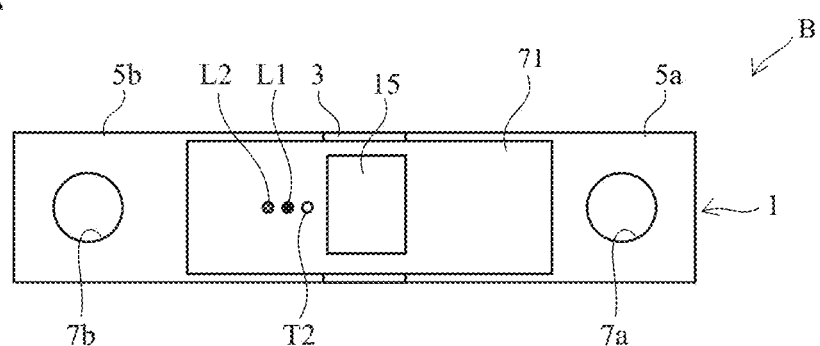
FIGS. 5A and 5B show a plan view and a side view illustrating a configuration example of a shunt resistor in a current measurement device according to a fifth embodiment of the present invention.
Figure 5B:
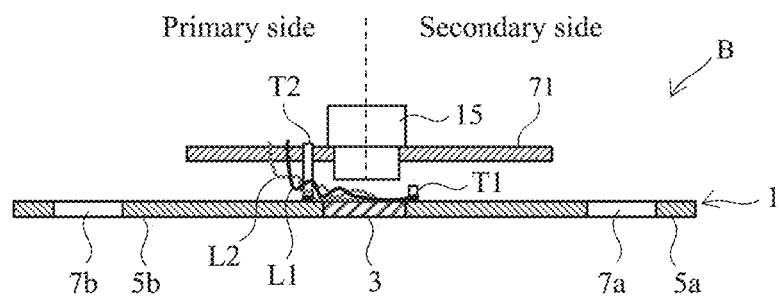

A current measurement device according to a fifth embodiment of the present invention will be described. FIGS. 5A and 5B show a plan view and a side view illustrating a configuration example of the current measurement device (shunt module) according to the present embodiment.

In the shunt module, the influence of self-inductance can be reduced by arranging the shunt resistor and the amplifier circuit substrate in proximity to each other. However, when the shunt resistor and the amplifier circuit substrate are close to each other, the influence of heating of the shunt resistor on the amplifier circuit substrate is a concern.

Referring to FIGS. 5A and 5B, the shunt resistor 1 includes the resistive element 3 and the electrodes 5a, 5b connected and secured to both ends of the resistive element 3. The electrodes 5a, 5b are provided with the through-holes 7a, 7b for securing to a bus bar or the like. The electrodes 5a, 5b are provided, in the vicinity of portions thereof connected with the resistive element 3, with the terminals T1, T2 for voltage extraction. An amplifier circuit substrate 71 is provided with circuit components, such as an isolation amplifier 15 for separation between a primary side and a secondary side, and wires. The shunt resistor 1 and the amplifier circuit substrate 71 are arranged with a predetermined separating distance maintained therebetween. The separating distance is maintained by, e.g., a case covering the amplifier circuit substrate 71, which is not illustrated. The wires L1, L2 connected to the terminal T1, T2 of the shunt resistor 1 are twisted in a state of being in contact with or in proximity to the shunt resistor, and then connected to the amplifier circuit substrate 71 to send voltage signals to the isolation amplifier 15. The terminal T2 extends vertically by such a length as to reach and penetrate the amplifier circuit substrate 71, and is connected to GND of the amplifier circuit substrate 71.

With such a 5-terminal system using electric wires and the like for signal output, it is also possible to suppress the influence of common-mode noise. The voltage signal wires are made of stranded wires, making it possible to reduce the influence of noise due to a magnetic flux even when the shunt resistor 1 and the amplifier circuit substrate 71 are separated from each other. The 5-terminal system indicates the shunt resistor composed of the electrodes 5a, 5b for current flow, the terminals T1, T2 for voltage extraction, and the terminal T3 (or a wire branching from T1 or T2) for guiding noise to GND, and/or the configuration of a current measurement device to which the shunt resistor is connected, and refers to the current measurement system according to the present invention.

Sixth Embodiment

Figure 6:
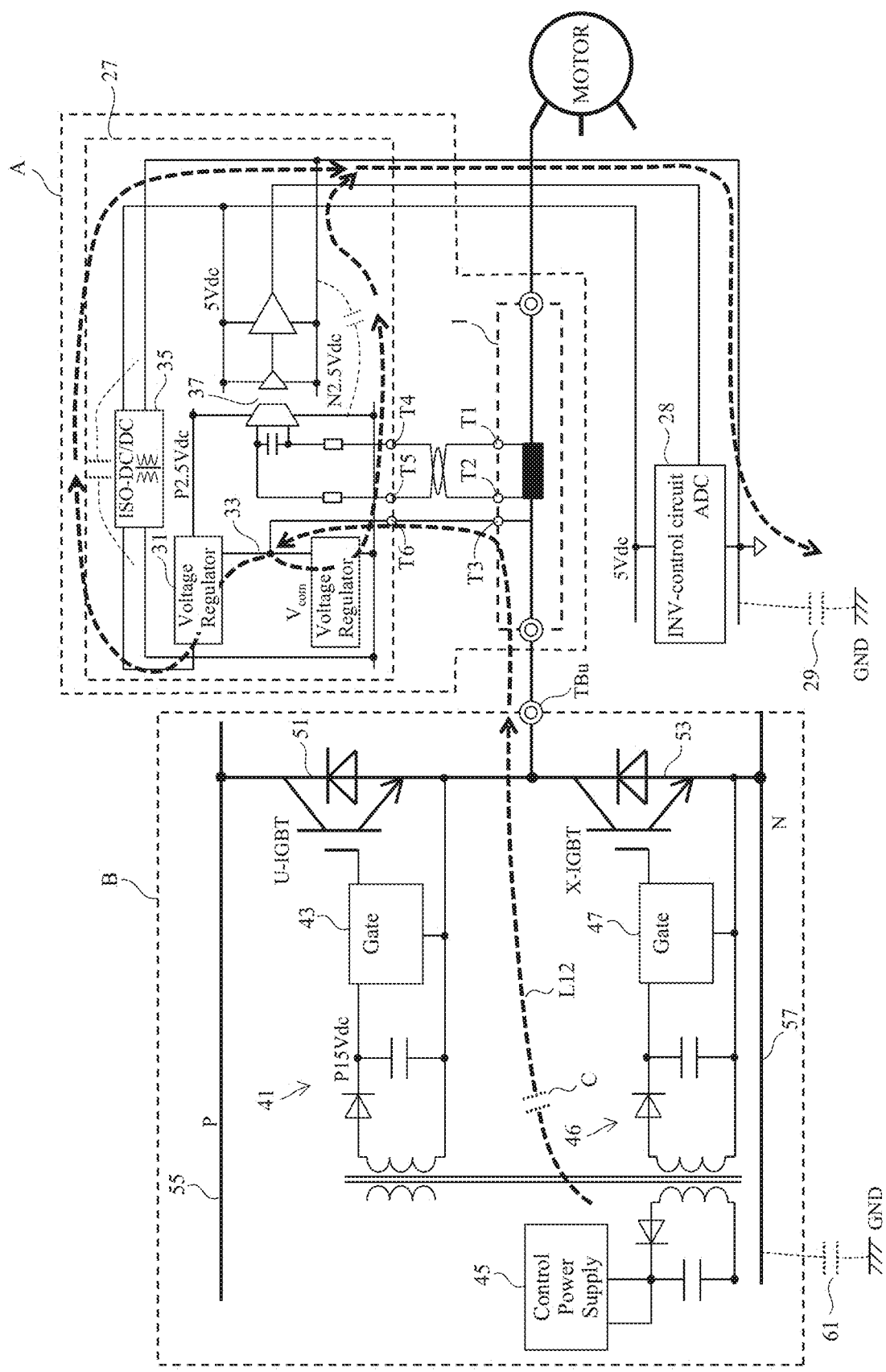
FIG. 6 illustrates an example of a circuit diagram of a current measurement device according to a sixth embodiment of the present invention.

FIG. 6 illustrates an example of a circuit diagram of a current measurement device according to a sixth embodiment of the present invention. FIG. 6 is an example of an inverter circuit for driving a three-phase motor, and illustrates one phase portion of an inverter bridge circuit.

The example illustrated in FIG. 6, which is an example of application of a shunt current detector of the 5-terminal system to an inverter circuit, includes an inverter bridge section B and a current measurement device A provided with the shunt resistor 1 and the amplifier circuit 27. The inverter bridge section B includes gate drive circuits (43, 47) which respectively control a first integrated gate bipolar transistor (IGBT) 51 and a second IGBT 53, and gate power supply circuits (41, 46). The gate power supply circuits 41, 46 are controlled by a power supply controller 45. The example is also provided with an inverter control circuit 28. The current measurement device A is provided with the shunt resistor 1 and an isolation amplifier 37.

An output terminal TBu of the inverter bridge section B and a load-side motor are connected to terminals, indicated by the electrodes 5a, 5b of the shunt resistor 1, for applying current to be measured.

As described above, the first signal output terminal T1 and the second signal output terminal T2 of the shunt resistor 1 for performing current detection in the inverter circuit provided with the switching elements are respectively connected to the two input terminals T4, T5 of the isolation amplifier 37 constituting the amplifier circuit. The third signal output terminal T3 is connected to the common line L4 (GND 31) of the current measurement device A provided with the amplifier circuit. Signs 29, 61 indicate floating capacitance.

Referring to FIG. 6, L12 indicates a common-mode noise generated by the potential at the output terminal TBu varying greatly toward the P side or N side due to switching of the IGBTs. The common-mode noise L12 of the inverter bridge section B flows from the output terminal TBu to the shunt resistor, and then flows from the third signal output terminal T3 to GND of the current measurement device A. Thus, a system is adopted in which a common line 33 of the amplifier circuit 11 is wired by the shunt resistor 1 via a route different from that of the signal output line, whereby the common-mode noise current of the signal output terminal TBu flows to GND. Accordingly, it is possible to perform current detection in which the influence of common-mode noise is reduced.

Seventh Embodiment

Figure 7:
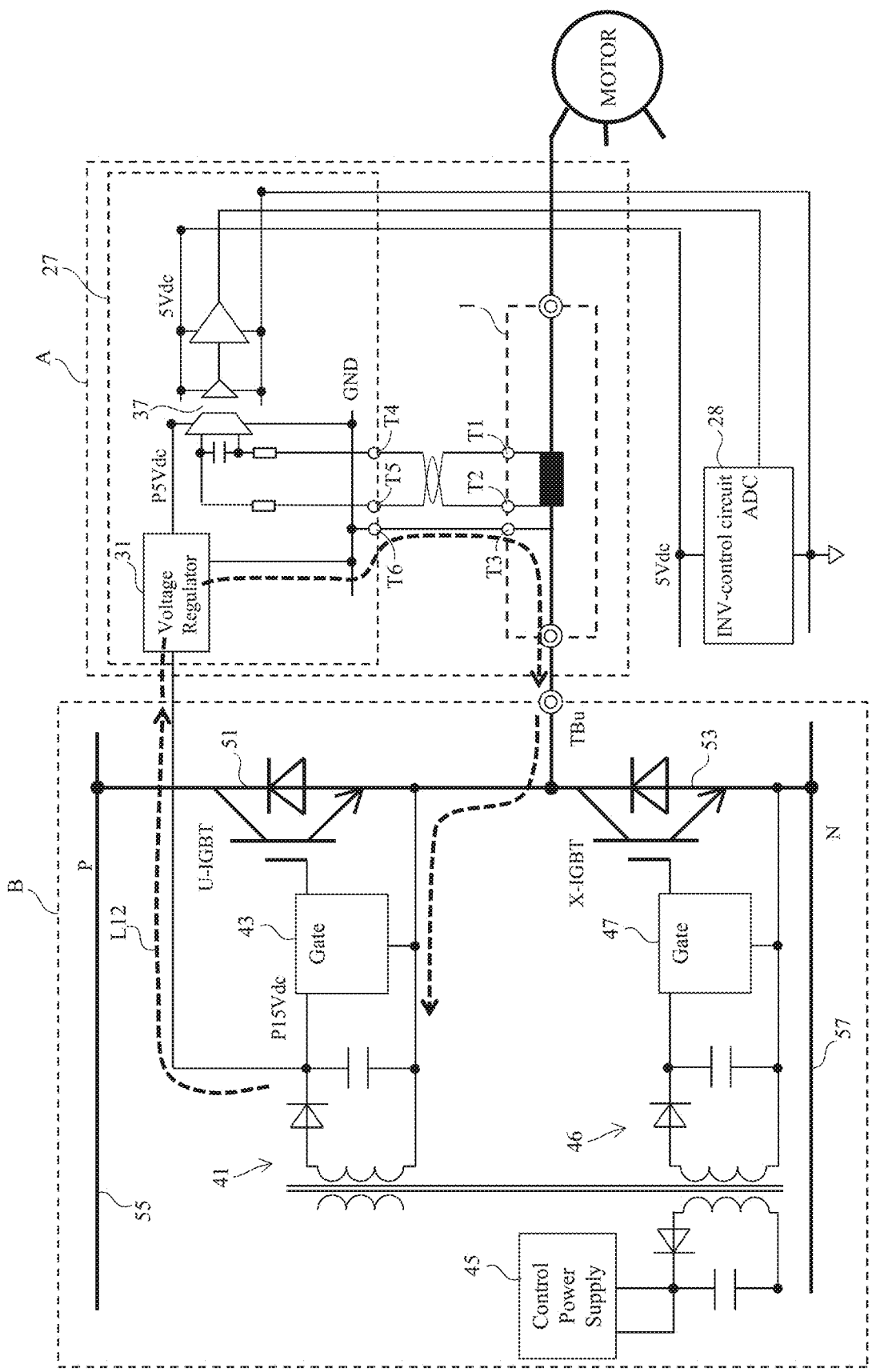
FIG. 7 illustrates an example of a circuit diagram of a current measurement device according to a seventh embodiment of the present invention, illustrating a circuit example in which, when applied to an inverter circuit, a gate power supply is utilized as a power supply for a shunt signal amplifier.

FIG. 7 illustrates an example of a circuit diagram of a current measurement device according to a seventh embodiment of the present invention. FIG. 7 is an example of an inverter circuit for driving a three-phase motor, and illustrates one phase portion of an inverter bridge circuit. In the circuit example, a gate power supply is utilized to provide power to the shunt signal amplifier (isolation amplifier 37). In this case, there is the advantage that, regarding noise into shunt signals (signals at the terminals T1, T2) due to current variation of the gate power supply, it is possible to bypass the noise to the output terminal TBu. Particularly, when a charge-pump type voltage regulator is used to supply power to the amplifier circuit, the noise may increase due to pulsed flow of power supply current. In such a case, it is helpful to use the 5-terminal system of the present invention, as in the present example.

In the foregoing embodiments, the configurations and the like that are illustrated in the drawings do not represent limitations and may be modified, as appropriate, as long as the effects of the present invention can be obtained. Other modifications may also be made, as appropriate, without departing from the scope of the object of the present invention.

The constituent elements of the present invention may be selectively adopted or not adopted, and an invention provided with the selected configurations is also included in the present invention.

INDUSTRIAL APPLICABILITY

The present invention may be utilized in a current measurement device.

All publications, patents and patent applications cited in the present description are incorporated herein by reference in their entirety.

The invention claimed is:

1. A current measurement device placed between a power source and an electric apparatus driven by a switching current from the power source, comprising:
   a shunt resistor forming a current path through which a shunt current is flowed through the shunt resistor, wherein the shunt resistor comprises a resistive element and first and second electrodes connected in line to form the current path with the shunt resistor arranged between the first and second electrodes, and the first and second electrodes are connected, respectively, to the power source and the electric apparatus;
   first and second voltage signal lines connected, respectively, to the first and second electrodes of the shunt resistor to detect a voltage signal generated across the first and second voltage signal lines by the shunt current flowing through the current path;
   an amplifier circuit having first and second input terminals connected, respectively, to the first and second voltage signal lines for amplification of the voltage signal; and
   a third signal line which is different from the first and second voltage signal lines and connected to the first electrode of the shunt resistor along the current path between the first voltage signal line and the power source, wherein the third signal line is also connected to a grounded common line so that noise coming from the power source through the shunt current is released from the current path through the third signal line before the noise enters the resistive element.

2. The current measurement device according to claim 1, wherein the third signal line releases a common-mode noise appearing across the first and second voltage lines to the grounded common line.

3. The current measurement device according to claim 1, wherein the amplifier circuit has a negative power supply terminal connected to the grounded common line.

4. The current measurement device according to claim 1, wherein the amplifier circuit has a GND terminal connected to the grounded common line.

5. The current measurement device according to claim 1, wherein the shunt resistor performs current detection in an inverter circuit provided with a switching element.

6. The current measurement device according to claim 1, wherein each of the first and second voltage signal lines are connected to the input terminals of the amplifier through a resistance.

7. The current measurement device according to claim 1, wherein the shunt resistor has a resistance value of not more than 0.1 mΩ.

* * * * *